US010600981B2

(12) United States Patent
So et al.

(10) Patent No.: US 10,600,981 B2
(45) Date of Patent: Mar. 24, 2020

(54) EXCIPLEX-SENSITIZED FLUORESCENCE LIGHT EMITTING SYSTEM

(71) Applicant: Universal Display Corporation, Ewing, NJ (US)

(72) Inventors: Woo-Young So, Richboro, PA (US); Nicholas J. Thompson, Trenton, NJ (US); Jerald Feldman, Wilmington, DE (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 16/111,282

(22) Filed: Aug. 24, 2018

(65) Prior Publication Data

US 2019/0081269 A1 Mar. 14, 2019

Related U.S. Application Data

(60) Provisional application No. 62/549,460, filed on Aug. 24, 2017.

(51) Int. Cl.
*H01L 51/50* (2006.01)
*H01L 51/52* (2006.01)

(52) U.S. Cl.
CPC ...... *H01L 51/5028* (2013.01); *H01L 51/5004* (2013.01); *H01L 51/5008* (2013.01); *H01L 51/5016* (2013.01); *H01L 51/5056* (2013.01); *H01L 51/5072* (2013.01); *H01L 51/5092* (2013.01); *H01L 51/5096* (2013.01); *H01L 51/5206* (2013.01); *H01L 51/5221* (2013.01); *H01L 51/5253* (2013.01)

(58) Field of Classification Search
CPC ............. H01L 51/5028; H01L 51/5004; H01L 51/5056; H01L 51/5008; H01L 51/5221; H01L 51/5072; H01L 51/5206; H01L 51/5096; H01L 51/5016; H01L 51/5253; H01L 51/5092
See application file for complete search history.

(56) References Cited

U.S. PATENT DOCUMENTS 4,769,292 A 9/1988 Tang
5,247,190 A 9/1993 Friend
(Continued)

FOREIGN PATENT DOCUMENTS

WO 2008057394 A1 5/2008
WO 2010011390 A2 1/2010

OTHER PUBLICATIONS

Baldo, "Highly efficient phosphorescent emission from organic electroluminescent devices," Nature, vol. 395, pp. 151-154, 1998.
(Continued)

*Primary Examiner* — Yasser A Abdelaziez
(74) *Attorney, Agent, or Firm* — Morris & Kamlay LLP (57) ABSTRACT

Emissive layer structures for organic emissive devices and emissive devices containing such structures are provided. The emissive layer includes one or more sub-layers or similar regions. A fluorescent emitter and two compounds that may form an exciplex are distributed within the sub-layers so as to enhance Forster transitions from the exciplex to the fluorescent acceptor and suppress undesirable Dexter transitions from the exciplex to the fluorescent acceptor.

19 Claims, 5 Drawing Sheets

(56) References Cited

U.S. PATENT DOCUMENTS

| | | |
|---|---|---|
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 7,279,704 B2 | 10/2007 | Walters |
| 7,431,968 B1 | 10/2008 | Shtein |
| 7,968,146 B2 | 6/2011 | Wagner |
| 2003/0230980 A1 | 12/2003 | Forrest |
| 2004/0174116 A1 | 9/2004 | Lu |
| 2006/0250076 A1* | 11/2006 | Hofmann ............... H01L 51/002 313/504 |
| 2012/0248421 A1* | 10/2012 | Yamazaki ........... H01L 51/5016 257/40 |
| 2013/0292656 A1* | 11/2013 | Seo ........................ H05B 33/14 257/40 |
| 2015/0171359 A1* | 6/2015 | Forrest ................ H01L 51/5024 257/40 |
| 2016/0268534 A1* | 9/2016 | Hosoumi ............ H01L 51/5012 |
| 2017/0022963 A1 | 1/2017 | DeBenedictis |
| 2017/0229663 A1 | 8/2017 | Tsai |

OTHER PUBLICATIONS

Baldo et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

* cited by examiner

EXCIPLEX-SENSITIZED FLUORESCENCE LIGHT EMITTING SYSTEM

CROSS-REFERENCE TO RELATED APPLICATIONS

This application claims the priority benefit of U.S. Provisional Patent Application Ser. No. 62/549,460, filed Aug. 24, 2017, the entire contents of which are incorporated herein by reference.

FIELD

The present invention relates to compounds for use as emitters, and devices, such as organic light emitting diodes, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative) Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

In an embodiment, an organic light emitting device is provided that includes an anode, a cathode, and an emissive layer disposed between the anode and the cathode that includes a first sub-layer comprising a first compound and a second compound and a second sub-layer comprising the first compound, the second compound, and a fluorescent third compound. The first compound and the second compound form an exciplex, and the fluorescent third compound is not present in the first sub-layer. Emission from the exciplex occurs within an energy region that overlaps an excitation band of the fluorescent third compound. The first sub-layer may have a thickness of at least 0.1 nm and not more than 10 nm. There may be a discrete boundary interface between the first sub-layer and the second sub-layer. The fluorescent third compound may be uniformly or non-uniformly distributed within the second sub-layer, including across a gradient within the second sub-layer.

In an embodiment, an organic light emitting device is provided that includes an anode, a cathode, and a emissive layer disposed between the anode and the cathode that includes a first compound and a second compound that form an exciplex and a fluorescent third compound that is distributed non-uniformly throughout the emissive layer. The fluorescent third compound is not present in any portion of the emissive layer within 0.1 nm of a first interface of the emissive layer with an adjacent layer of the device. Emission from the exciplex occurs within an energy region that overlaps an excitation band of the fluorescent third compound.

In an embodiment, an organic light emitting device is provided that includes an anode, a cathode, and an emissive layer disposed between the anode and the cathode that includes a first compound and a second compound that form an exciplex, and a fluorescent third compound. The first compound and the second compound are distributed non-uniformly throughout the emissive layer, and emission from the exciplex occurs within an energy region that overlaps an excitation band of the fluorescent third compound. The emissive layer may include a first sub-layer comprising the first compound, a second sub-layer comprising the first compound, the second compound, and the fluorescent third compound. The second compound may not be present in the first sub-layer and the first compound may not be present in the third sub-layer. The first compound may be distributed uniformly within the first sub-layer and/or the second compound may be distributed uniformly within the third sub-layer. The fluorescent third compound may be uniformly or non-uniformly distributed in the second sub-layer, including along a gradient within the second sub-layer.

In various embodiments, the concentration of the fluorescent compound within any sub-layer that contains the fluorescent compound may vary from 0.1% to 7% by volume, 1-3% by volume, or any intermediate value, range, or gradient.

In various embodiments, the singlet excited state of the fluorescent compound may be lower than the singlet excited state of the exciplex, and/or the lowest wavelength emitted by the exciplex is lower than the highest wavelength of the excitation band of the fluorescent third compound. Transitions from the triplet state of the exciplex to the triplet state of the fluorescent compound may be suppressed. The suppression may be due to, for example, an average distance between the exciplex and the fluorescent compound within one or more layers that contain one or both of the exciplex and the fluorescent compound.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
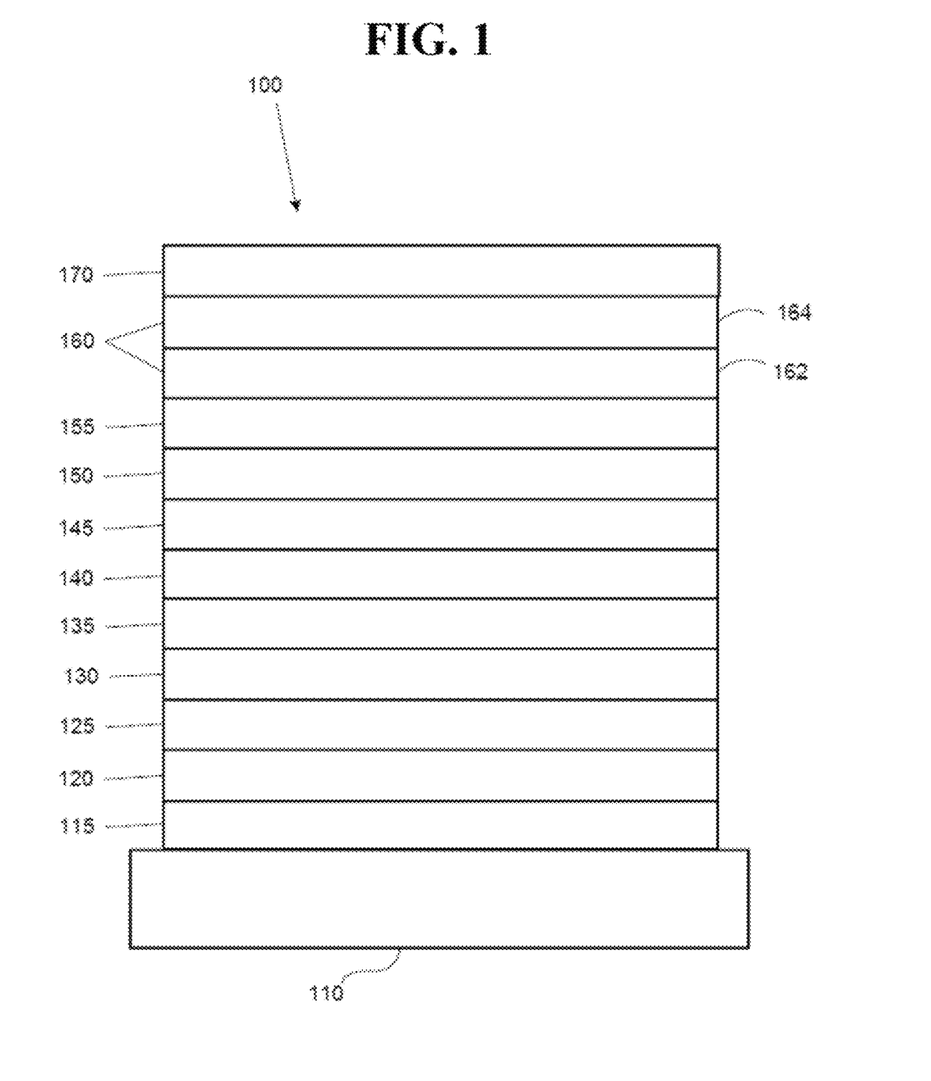
FIG. 1 shows an organic light emitting device having a structure suitable for use with embodiments of the disclosed invention.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
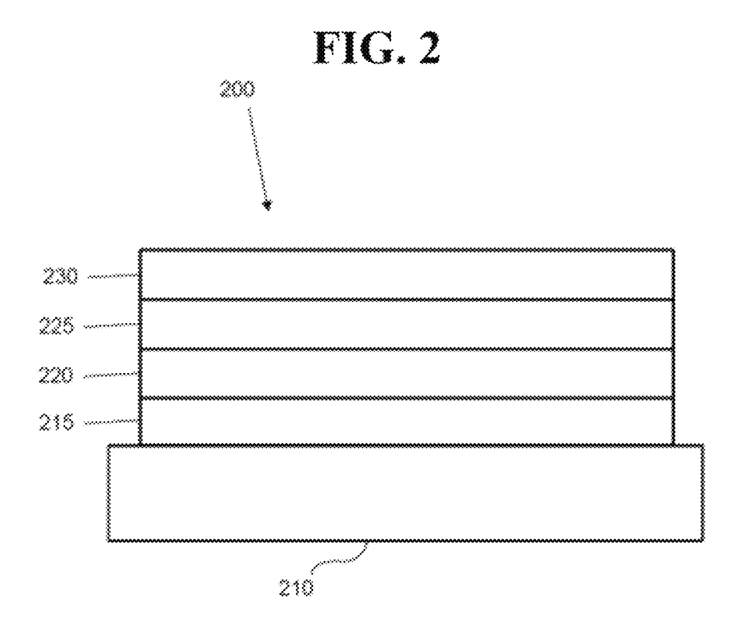
FIG. 2 shows an inverted organic light emitting device that does not have a separate electron transport layer having a structure suitable for use with embodiments of the disclosed invention.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED may include an emissive layer having two sub-layers as disclosed herein.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

It has been found that it may be desirable to use particular combinations of host and guest (dopant) materials to enhance and/or suppress various energy transfers within the emissive region and thereby improve the efficiency of the emissive region. For example, in many cases it may be desirable to enhance or encourage Forster-type energy transitions and/or to suppress Dexter-type energy transitions within the emissive region. As is understood in the art, Forster energy transitions transfer energy between the guest and the host via dipolar oscillation. In contrast, Dexter transfer occurs when the host and guest materials exchange electrons due to orbital overlap between the two.

Various arrangements have been used to enhance desirable energy transfer processes and suppress undesirable transfers. For example, U.S. Pat. No. 9,941,481 uses a host material that forms an exciplex and a guest dopant fluorescent material. The materials are arranged uniformly within the emissive layer such that the distance between centroids of the fluorescent material and at least one component of the exciplex is at least 0.7 nm, but not more than 5 nm. Because Dexter transitions typically require much shorter distances than Forster transitions, this arrangement enhances Forster transitions and suppresses Dexter transfer.

Embodiments disclosed herein provide structures and arrangements to enhance Forster energy transfer from an exciplex to an acceptor guest/dopant compound, by suppressing triplet-triplet Dexter energy quenching processes. These processes generally are inefficient in terms of emission within the emissive region and result in non-emissive or undesirable energy transfer. These transitions may be suppressed due to, for example, the average distance between an exciplex and a fluorescent emissive compound within the emissive layer, or within one or more sub-layers within the emissive layer. Using a fluorescent guest/dopant emissive material as an acceptor in combination with exciplex donors improves stability due to the relatively short radiation transition time. Arrangements disclosed herein also may improve device efficiency, which typically may be limited by longer transient times common to phosphorescent emitters and the relatively lower exciton capture common to conventional fluorescent emitters.

Figure 3:
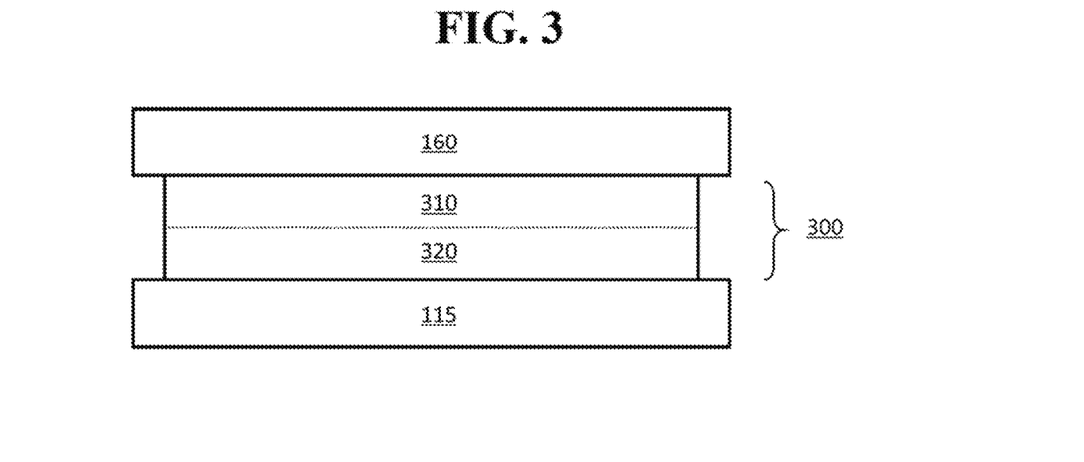
FIG. 3 shows an example schematic representation of a device having an emissive layer with two sub-layers according to an embodiment of the disclosed invention.

FIG. 3 shows an example schematic representation of a device having an emissive layer with two sub-layers. The device may include other layers, such as those described with respect to FIGS. 1 and 2, which are omitted for clarity. The emissive layer 300 includes two sub-layers 310 and 320. One sub-layer 310 includes two host materials that form an exciplex. The use of an exciplex may be desirable because it typically will have a relatively small energy gap between the singlet and triplet energy states, and the triplet state may result in thermally-assisted emission for the emissive guest compound. Furthermore, the separation of charges in the exciplex will help prevent quenching of emissive states via Dexter transfer to the acceptor guest emissive compound.

Figure 4A:
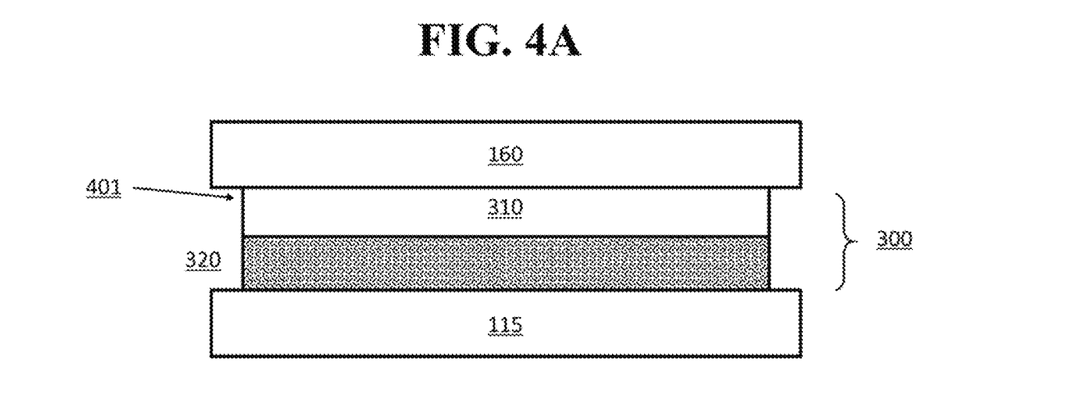
FIGS. 4A and 4B show schematic representations of example emissive layers according to embodiments of the invention.

In some embodiments, the emissive layer 300 may include two distinct sub-layers that are separated by a discrete boundary interface. An example of such an arrangement is shown in FIG. 4A. As used herein, a "discrete boundary interface" between layers or sub-layers refers to a clear physical boundary between the layers or sub-layers, such as would result if the layers were fabricated separately and individually, leading to a visible physical separation between the two. In such an arrangement, the first sub-layer 310 may include the exciplex host materials but omit any amount of the fluorescent emitter. The second sub-layer 320 may include the exciplex host materials as well as the fluorescent emissive material. It has been found that the presence of the first sub-layer 310 further enhances Forster energy transfer because the shorter-range, quenching Dexter transitions require the presence of both the acceptor and donor molecules within the same region. Accordingly, the "removal" of acceptor molecules from at least a portion of the emissive layer, such as via a layer 310 that does not include the fluorescent emitter/acceptor, can eliminate the shorter-range Dexter transitions. However, the longer-range Forster transitions still may occur within the emissive layer, allowing for efficient emission from the layer as a whole.

Figure 4B:
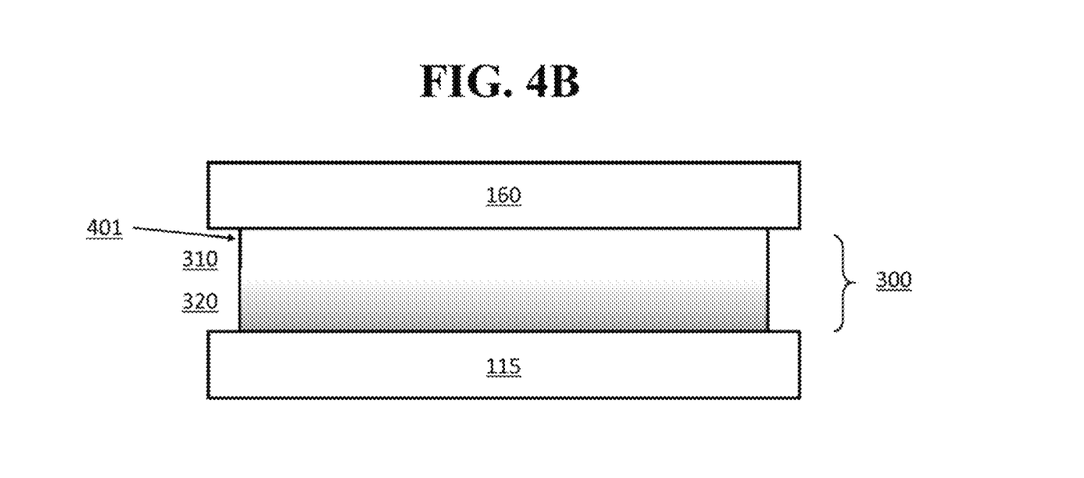

Alternatively, the emissive layer 300 may not have a discrete boundary interface between the sub-layers, but rather may include a gradient transition between the first sub-layer, which does not include the fluorescent emissive material, and the second sub-layer, which does include the emitter. FIG. 4B shows an example of such an arrangement. In this case, the beginning of the first sub-layer relative to the second may be defined as a point at which the concentration of the fluorescent emissive material is below a threshold minimum, such as 0.01%, or the point at which the concentration of the fluorescent emissive material is 0%.

More generally, it may be desirable for an emissive layer as disclosed herein to include a region in which none of the fluorescent emitter/acceptor compound is located within a minimum distance of the outer limits of the emissive layer, i.e., within a specified range of an adjacent layer of the device. For example, referring again to FIGS. 4A and 4B, it may be desirable for a region 401 to exclude the fluorescent emitter/acceptor compound that is present in the sub-layer 320. The region 401 may extend from the layer directly above the sub-layer 310 (or below, in an inverted device) to a threshold distance, such as a distance in the range of 0.1-10 nm. That is, for a threshold distance of 0.1 nm, there will be no fluorescent emitter compound within 0.1 nm of the adjacent layer (cathode 160 in FIGS. 4A-4B, but more generally any adjacent layer as previously disclosed). This arrangement may be used regardless of whether there is a discrete boundary interface between the sub-layers 310, 320.

The region that does not include the fluorescent emitter, whether it is a region such as 401 or an entire sub-layer such as 310 that does not include the fluorescent emissive material, may have a minimum thickness of 0.1 nm or more, such as 0.1 nm, 0.5 nm, 1.0 nm, 2.0 nm, 3.0 nm, 4.0 nm, 5.0 nm, up to about 10 nm, or any intervening thickness. Enforcing a minimum thickness of the sub-layer may serve to guarantee that there is a portion of the emissive layer that does not include the fluorescent emissive/acceptor material so as to achieve the effects disclosed herein.

Regardless of the interface between the first and second sub-layers, the second sub-layer may include various distributions of the fluorescent compound within the sub-layer. For example, the recombination zone profile of the emissive layer may be controlled by adjusting the relative ratio of the two components of the exciplex. As a specific example, if the doping concentration of the e-type material which forms the exciplex may begin at 50% and increase in concentration as a function of the distance within layer from one electrode. In this case, the recombination zone will preferentially be at the beginning of the EML, i.e., closer to the electrode at the lower-concentration portion of the layer. By placing the fluorescent doping at the end of the EML, Dexter quenching may be further reduced as the spatial distance between the exciplex and the acceptor is maximized within the EML. Thus, the exciton profile of the emissive layer may be controlled to achieve a higher efficiency than would be possible in conventional arrangements. Furthermore, the position of the recombination zone may be controlled more precisely in contrast to configurations such as those disclosed in U.S. Pat. No. 9,941,481, which has a uniform distribution of both emitter and exciplex molecules throughout the single emissive layer. Confining exciton formation within a central portion of the EML as is possible with embodiments disclosed herein may provide greatly increased efficiency and stability.

Figure 5:
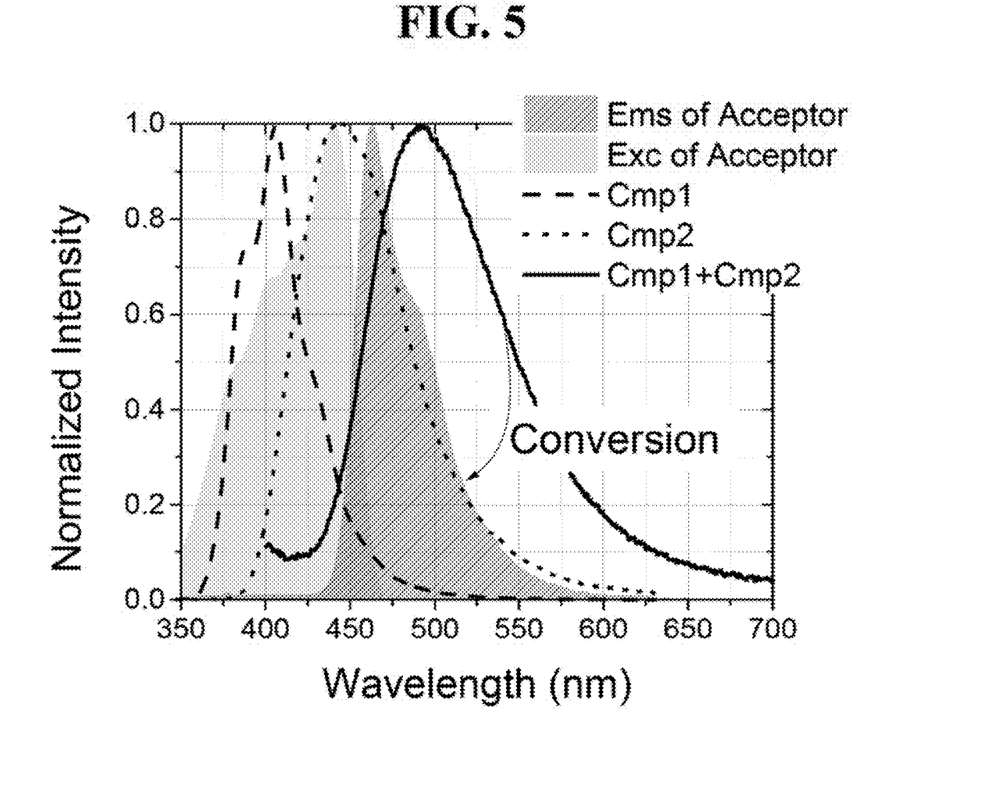
FIG. 5 shows an example of the emissive wavelength regions of the acceptor, the exciplex, and the individual compounds that form the exciplex according to embodiments of the invention.

In embodiments disclosed herein, it may be useful for the exciplex formed by the two compounds in the emissive layer to have an emissive band that overlaps with an excitation band of the fluorescent emitter. The exciplex typically will have a lower emission region than each of the individual compounds. Because the exciplex emission region overlaps the fluorescent emitter (acceptor) excitation band, Forster transfer can occur between them to generate emission by the emitter at a higher energy than the exciplex emission range. FIG. 5 shows an example of the emissive wavelength regions of the acceptor, the exciplex, and the individual compounds that form the exciplex according to an embodiment disclosed herein. As shown, within the overlap of the exciplex and the fluorescent emitter, conversion from the exciplex to the emitter may occur. This is due to the relative energy levels of the exciplex and the fluorescent emitter. Any amount of overlap may achieve some degree of the desired transitions. However, in general, the greater the overlap between the emission spectrum of the donor exciplex and the absorption spectrum of the acceptor emitter, the faster the desirable Forster transfer will occur, leading to improved efficiency.

Figure 6:
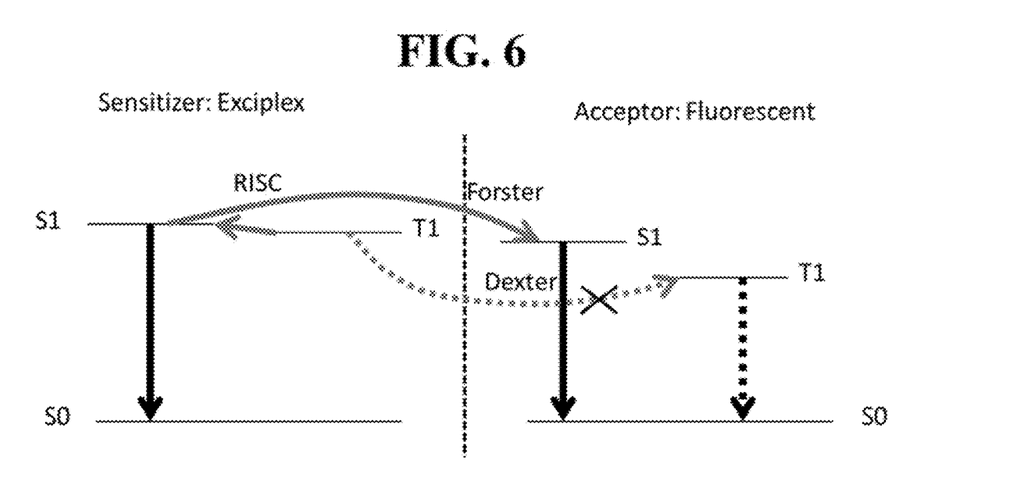
FIG. 6 shows an example energy level diagram according to embodiments of the invention disclosed herein.

FIG. 6 shows an example energy level diagram according to embodiments disclosed herein, in which there is a relatively small energy difference between the singlet and triplet states in the exciplex. Dexter energy transfer, which requires electron movement between two molecules, may be reduced due to the relatively large separation of the exciplex-forming molecules. Furthermore, Dexter energy transfer may be virtually or entirely prohibited by separation of the exciplex formation layer and an acceptor-containing layer such as through the use of multiple sub-layers as disclosed herein. However, the preferred Forster transfer between the singlet states of the exciplex and the fluorescent emitter may be maintained or enhanced due to the preferential separation between the two states.

Figure 7:
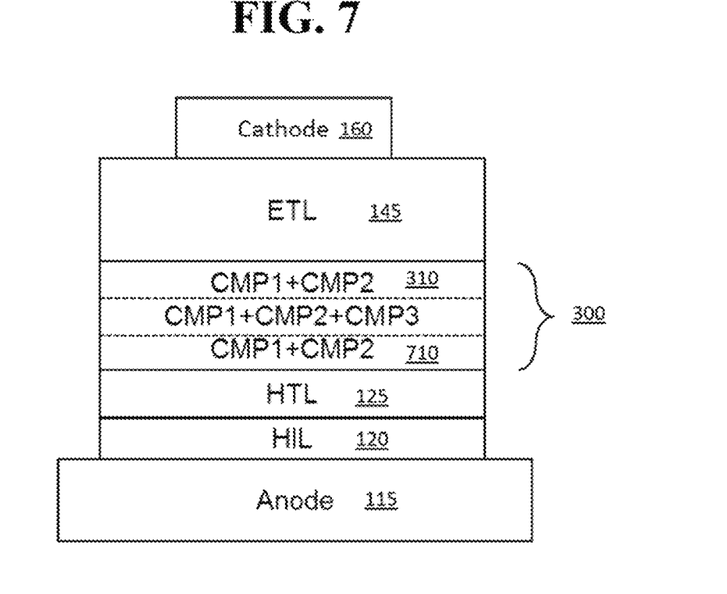
FIG. 7 shows an example device structure in which the emissive layer includes two or more sub-layers, only one of which includes a fluorescent emitter, according to embodiments of the invention disclosed herein.

FIG. 7 shows an example device structure in which the emissive layer includes two or more sub-layers, only one of which includes the fluorescent emitter (CMP3). As previously disclosed herein, such an arrangement may allow for more precise control of the exciton formation region, which preferably is separate from the charge transport layers to prevent exciton-polaron interactions. Such interactions may be a primary degradation pathway, and thus it generally is desirable to reduce or eliminate them within the device. The device includes an anode 115, cathode 160, and various layers disposed between them such as electron transport layer 145, hole transport layer 125, hole injection layer 120, and the like. The device may include additional layers and structures, such as those described with respect to FIGS. 1-2, as well as other common OLED structures such as stacked device structures, charge generation layers, and the like. The emissive layer 300 may include one or more sub-layers 310, 710 that do not include a fluorescent emitter, as previously disclosed. The layer(s) 310, 710 may include two compounds that form an exciplex, as previously disclosed, noted as CMP1 and CMP2. The sub-layer 320 may include the two exciplex materials CMP1, CMP2, as well as the fluorescent emitter CMP3 as previously disclosed.

Figure 8:
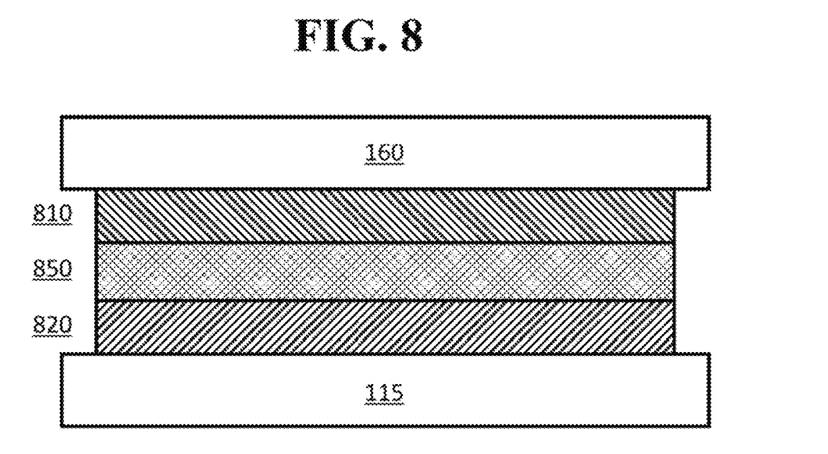
FIG. 8 shows an example device structure in which the emissive layer includes three sub-layers, only one of which provides for exciplex formation by the two exciplex-forming compounds.

Alternatively or in addition to the previously-disclosed arrangements, in some embodiments three sub-layers may be used so that only a portion of the emissive layer includes an exciplex. For example, FIG. 8 shows an illustrative schematic structure of such an emissive layer that includes three sub-layers 810, 820, 850. In this arrangement, each of the sub-layers 810, 820 includes only one of the compounds that together form an exciplex. The sub-layer 850 includes both compounds, and the compounds form an exciplex within the sub-layer. The fluorescent emissive compound is disposed only or predominantly within the sub-layer 850. Thus, no exciplex is formed at the two outer boundaries of the emissive layer, i.e., within the sub-layers 810, 820. The exciplex-forming compounds may be distributed within each sub-layer uniformly, or there may be a non-uniform distribution within each sub-layer. For example, a first exciplex-forming compound may be distributed with a lower concentration closer to the top of the first sub-layer 810, and a higher concentration toward the bottom of the sub-layer 810, and similarly through the sub-layer 850. As another example, the exciplex-forming compounds may be distributed at gradient concentrations within each of the sub-layers 810, 820 and uniformly distributed within the sub-layer 850. As another example, in a configuration similar to those previously described with respect to the threshold region 410, the sub-layers 810, 820 may represent threshold regions in which each of the two exciplex-forming compounds is not found. That is, both exciplex-forming compounds may be present, with uniform distribution or otherwise, throughout the emissive layer with the exception of a region at either end of the emissive layer, i.e., closest to the interface of the emissive layer with an adjacent layer. As previously disclosed, the transition from one sub-layer to another may be a discrete boundary interface, or there may be a gradient transition between sub-layers. The fluorescent emissive material may be distributed, uniformly or otherwise, throughout any or all of the sub-layers and regions of the emissive layer, including any or all of sub-layers 810, 820, 850.

In general, for any of the arrangements disclosed herein, the fluorescent emissive compound may be distributed within the region containing it uniformly, or it may be distributed in a gradient within the region or sub-layer. Similarly, any region or sub-layer that includes one or more of the exciplex-forming compounds may include a uniform distribution of the compound or compounds, or one or more of the compounds may be distributed along a gradient within the region or sub-layer(s) that contain the compound or compound(s). Where two compounds are distributed within a sub-layer or region, each compound may be distributed uniformly or non-uniformly independently of the distribution of any other compounds within the layer.

The fluorescent emissive material used in embodiments herein may be provided at various concentrations, which concentrations may be uniformly or non-uniformly distributed throughout the sub-layer(s) containing the fluorescent material as previously disclosed. For example, embodiments in which the fluorescent emissive material is distributed along a gradient within a sub-layer may use gradients of 0.1% to 7% by volume, or any intermediate range such as 1-3%, 2-5%, 3-5%, or the like. Embodiments in which the fluorescent emissive material is uniformly distributed within a sub-layer may include concentrations within the same ranges, such as 0.1%, 0.5%, 1%, 5%, 7%, or the like.

To fabricate devices disclosed herein, the structures may be built layer-upon-layer using techniques known in the art, such as disclosed in relation to FIGS. 1-2. Sub-layers may be fabricated independently of one another, or they may be fabricated as part of a single process during which the layer components are modified to achieve the appropriate contents and/or concentrations of compounds within the sub-layers. In layers such as shown in FIG. 4B, a gradient concentration may be achieved by changing the concentration of compounds used in the fabrication process, or by depositing many partial sub-layers, each having a slightly different concentration. More generally, any suitable process may be used to deposit any of the various layers, sub-layers, compounds, and combinations thereof disclosed herein.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. An organic light emitting device comprising:
   an anode;
   a cathode; and
   an emissive layer disposed between the anode and the cathode, the emissive layer comprising:
      a first sub-layer comprising a first compound and a second compound; and
      a second sub-layer comprising the first compound, the second compound, and a fluorescent third compound;
   wherein the first compound and the second compound form an exciplex;
   wherein the fluorescent third compound is not present in the first sub-layer; and
   wherein emission from the exciplex occurs within an energy region that overlaps an excitation band of the fluorescent third compound.

2. The device of claim 1, wherein the first sub-layer has a thickness of at least 0.1 nm and not more than 10 nm.

3. The device of claim 1, wherein there is a discrete boundary interface between the first sub-layer and the second sub-layer.

4. The device of claim 1, wherein the fluorescent third compound is uniformly distributed within the second sub-layer.

5. The device of claim 1, wherein the fluorescent third compound is non-uniformly distributed within the second sub-layer.

6. The device of claim 5, wherein the fluorescent third compound is distributed along a gradient within the second sub-layer.

7. The device of claim 6, wherein the gradient of concentration of fluorescent third compound within the second sub-layer varies from 0.1% to 7% by volume.

8. The device of claim 1, wherein the second sub-layer comprises a concentration of the fluorescent third compound in the range of 0.1% to 7% by volume.

9. The device of claim 8, wherein the concentration is 1-3% by volume.

10. The device of claim 1, wherein:
    the singlet excited state of the fluorescent third compound is lower than the singlet excited state of the exciplex; and
    transitions from the triplet state of the exciplex to the triplet state of the fluorescent third compound are suppressed.

11. The device of claim 10, wherein the transitions are suppressed due to an average distance between the exciplex and the fluorescent third compound within the second sub-layer.

12. The device of claim 1, wherein the lowest wavelength emitted by the exciplex is lower than the highest wavelength of the excitation band of the fluorescent third compound.

13. An organic light emitting device comprising:
 an anode;
 a cathode; and
 an emissive layer disposed between the anode and the cathode, the emissive layer comprising:
  a first sub-layer comprising a first compound and a second compound that form an exciplex; and
  a second sub-layer comprising the first compound, the second compound, and a fluorescent third compound;
 wherein the fluorescent third compound is distributed non-uniformly throughout the emissive layer;
 wherein the concentration of the fluorescent third compound is 0% within each and every portion of the emissive layer that is within 0.1 nm of a first interface of the emissive layer with an adjacent layer of the device; and
 wherein emission from the exciplex occurs within an energy region that overlaps an excitation band of the fluorescent third compound.

14. The device of claim 12, wherein the gradient of concentration of fluorescent third compound within the emissive layer varies from 0.1% to 7% by volume.

15. The device of claim 12, wherein the emissive layer comprises a concentration of the fluorescent third compound in the range of 0.1% to 7% by volume.

16. An organic light emitting device comprising:
 an anode;
 a cathode; and
 an emissive layer disposed between the anode and the cathode, the emissive layer comprising:
  a first sub-layer comprising a first compound and a second compound that form an exciplex; and
  a second sub-layer comprising the first compound, the second compound, and a fluorescent third compound;
 wherein the fluorescent third compound is not present in the first sub-layer;
 wherein the first compound and the second compound are distributed non-uniformly throughout the emissive layer; and
 wherein emission from the exciplex occurs within an energy region that overlaps an excitation band of the fluorescent third compound.

17. The device of claim 16, wherein the emissive layer comprises:
 a third sub-layer comprising the first compound, wherein the second compound is not present in the third sub-layer; and
 a fourth sub-layer comprising the second compound, wherein the first compound is not present in the fourth sub-layer.

18. The device of claim 17, wherein the first compound is distributed uniformly within the third sub-layer and the second compound is distributed uniformly within the fourth sub-layer.

19. The device of claim 16, wherein the fluorescent third compound is non-uniformly distributed in the second sub-layer.

* * * * *